US012763788B2

(12) United States Patent
Chao

(10) Patent No.: US 12,763,788 B2
(45) Date of Patent: Oct. 13, 2026

(54) APPARATUS AND METHOD FOR WIDE INPUT RANGE SUCCESSIVE APPROXIMATION REGISTER (SAR) ANALOG-TO-DIGITAL CONVERTER (ADC) WITH INTEGRATED VOLTAGE ATTENUATION

(71) Applicant: Yuan-Ju Chao, Cupertino, CA (US)

(72) Inventor: Yuan-Ju Chao, Cupertino, CA (US)

( * ) Notice: Subject to any disclaimer, the term of this patent is extended or adjusted under 35 U.S.C. 154(b) by 143 days.

(21) Appl. No.: 18/913,725

(22) Filed: Oct. 11, 2024

(65) Prior Publication Data

US 2026/0106625 A1 Apr. 16, 2026

(51) Int. Cl.
*H03M 1/12* (2006.01)
*H03M 1/46* (2006.01)

(52) U.S. Cl.
CPC ............. *H03M 1/129* (2013.01); *H03M 1/46* (2013.01)

(58) Field of Classification Search
CPC ........ H03M 1/468; H03M 1/129; H03M 1/46; H03M 1/069; H03M 1/38; H03M 1/0602; H03M 1/0612; H03M 1/0854; H03M 1/1009; H03M 1/1061; H03M 1/123; H03M 1/124; H03M 1/1245; H03M 1/125; H03M 1/144; H03M 1/145; H03M 1/162; H03M 1/164; H03M 1/206; H03M 1/365; H03M 1/44; H03M 1/462; H03M 1/804; H03M 3/426
USPC .......................................... 341/155, 161, 172
See application file for complete search history.

(56) References Cited

U.S. PATENT DOCUMENTS

| | | | | |
|---|---|---|---|---|
| 8,072,360 | B2 * | 12/2011 | Byrne | H03M 1/1225 341/172 |
| 8,471,755 | B1 * | 6/2013 | Figueiredo | H03M 1/468 341/172 |
| 8,766,833 | B1 * | 7/2014 | Bogner | H03M 1/1014 341/120 |
| 8,933,830 | B1 * | 1/2015 | Jeon | H03M 1/1071 341/110 |
| 9,380,235 | B2 * | 6/2016 | Sato | H03M 1/466 |
| 9,553,599 | B1 * | 1/2017 | Chen | H03M 1/1033 |
| 9,559,716 | B1 * | 1/2017 | Matsui | H03M 1/1061 |
| 9,667,266 | B1 * | 5/2017 | Shen | G11C 27/026 |
| 9,680,492 | B1 * | 6/2017 | Farley | H03M 1/0863 |
| 9,712,181 | B1 * | 7/2017 | Chen | H03M 1/68 |
| 9,831,889 | B1 * | 11/2017 | Abu Hilal | H03K 5/2472 |
| 10,084,467 | B1 * | 9/2018 | Chang | H03M 1/38 |

* cited by examiner

*Primary Examiner* — Linh V Nguyen
(74) *Attorney, Agent, or Firm* — PatentPC PowerPatent; Bao Tran

(57) ABSTRACT

The present invention relates to a Successive Approximation Register (SAR) Analog-to-Digital Converter (ADC) capable of handling large input voltage ranges beyond the supply voltage (VDD) through integrated voltage attenuation. By introducing a series capacitor (Cx) between the input and the Digital-to-Analog Converter (DAC) capacitors, the SARADC achieves input voltage attenuation without the need for external resistor dividers. The proposed configuration supports both single-ended and differential modes, allowing the SARADC to process wide-ranging input voltages while minimizing power consumption, circuit complexity, and silicon area.

19 Claims, 9 Drawing Sheets

APPARATUS AND METHOD FOR WIDE INPUT RANGE SUCCESSIVE APPROXIMATION REGISTER (SAR) ANALOG-TO-DIGITAL CONVERTER (ADC) WITH INTEGRATED VOLTAGE ATTENUATION

BACKGROUND

FIG. 1 illustrates a functional diagram of N-bit Successive Approximation Register Analog-Digital Converter (SARADC). This SARADC includes a Track/Hold circuit, a Comparator, N-bit DAC and Binary Search Logic. In operation, the analog input voltage (VIN) is sampled by the Track/Hold circuit. Initially, N-bit DAC is set to midscale (e.g., 100 . . . 00 in binary), producing a DAC output voltage (VDAC) equal to half of the reference voltage (VREF/2), where VREF represents the reference voltage supplied to the SARADC. The Comparator compares VIN to VDAC, and based on the comparison result, determines the next operation in the successive approximation process. Specifically, when VIN exceeds VDAC, the Comparator outputs a logic high signal, retaining the most significant bit (MSB) of the N-bit register as "1." Conversely, if VIN is less than VDAC, the Comparator outputs a logic low signal, clearing the MSB to "0." This process is repeated, adjusting the DAC output to subsequent fractions of VREF (e.g., VREF/4), and continues through a binary search until the least significant bit (LSB) of the N-bit register is resolved, thereby completing the analog-to-digital conversion.

In the single-ended configuration of a conventional SARADC, the maximum input voltage that can be converted without saturation is VREF, and any input voltage exceeding VREF results in saturation of the ADC, yielding an output code consisting entirely of logical "1"s, commonly referred to as "over-range." In contrast, in the differential configuration of a SARADC, the maximum input range is 2VREF. All components of the SARADC are typically powered by a supply voltage, VDD, which imposes an upper limit on the reference voltage (VREF), such that the maximum input voltage for single-ended and differential configurations is limited to VDD and 2VDD, respectively.

When the input voltage exceeds the supply voltage (VDD), conventional SARADC architectures utilize a voltage divider circuit to reduce the input voltage to within the acceptable input range of the ADC. FIG. 2 illustrates a typical voltage divider, consisting of resistors R1 and R2, where the output voltage VIN2 is a scaled version of the input voltage VIN, determined by the ratio of R2/(R1+R2). However, the use of such a voltage divider introduces several drawbacks, including increased thermal noise generated by the resistors, limited driving capability, and higher power consumption due to the need to drive the voltage divider.

This invention addresses these limitations by introducing a novel configuration that eliminates the need for a pre-ADC voltage divider. The proposed configuration incorporates minimal additional circuitry to achieve the function of voltage division without the associated increase in power consumption, while maintaining accurate and efficient operation of the SARADC.

SUMMARY

This invention provides a new architecture for Successive Approximation Register (SAR) Analog-to-Digital Converters (ADC) that integrates a voltage attenuation method to accommodate large input voltage ranges beyond the supply voltage (VDD). In traditional SARADC designs, input voltages higher than the supply voltage require external resistor-based voltage dividers to scale the input down. However, these dividers introduce thermal noise, increased power consumption, and complexity. To solve these issues, this invention introduces a series capacitor (Cx) in the input path, reducing the input voltage efficiently without external components.

The attenuation factor is controlled by the ratio of the series capacitor (Cx) to the total DAC capacitance, ensuring that the input voltage is appropriately scaled to prevent saturation of the ADC. This method supports both single-ended and differential input configurations, allowing the SARADC to process a wide range of input voltages without altering the core binary search and conversion process. The invention also leverages switch timing optimization to minimize charge injection, thereby enhancing the accuracy of the sampling phase.

Moreover, this SARADC architecture offers multiple input channels, which can handle both standard and high input voltages within the same system, reducing the need for additional circuitry. This integration results in lower power consumption, reduced circuit complexity, and optimized silicon area utilization. The invention is ideal for high-performance applications that require ADCs to process a broad range of input amplitudes while maintaining precision and efficiency.

DETAILED DESCRIPTION

The present invention is described with reference to specific embodiments and accompanying drawings, but the scope of the invention is defined by the claims. The drawings are schematic and illustrative, and the dimensions of certain elements may be exaggerated or not drawn to scale for clarity. Terms such as "first," "second," and "third" are used to distinguish between similar elements and should not imply a particular sequence. These terms are interchangeable, and the invention may function in sequences different from those described.

The term "comprising" is used in the claims and should not be interpreted as limiting the scope to the elements explicitly listed. For example, "a device comprising means A and B" includes additional elements or connections that transfer signals between A and B, which may include intermediate devices. The term "coupled" encompasses both direct and indirect connections and should not be limited to direct coupling.

Figure 1:
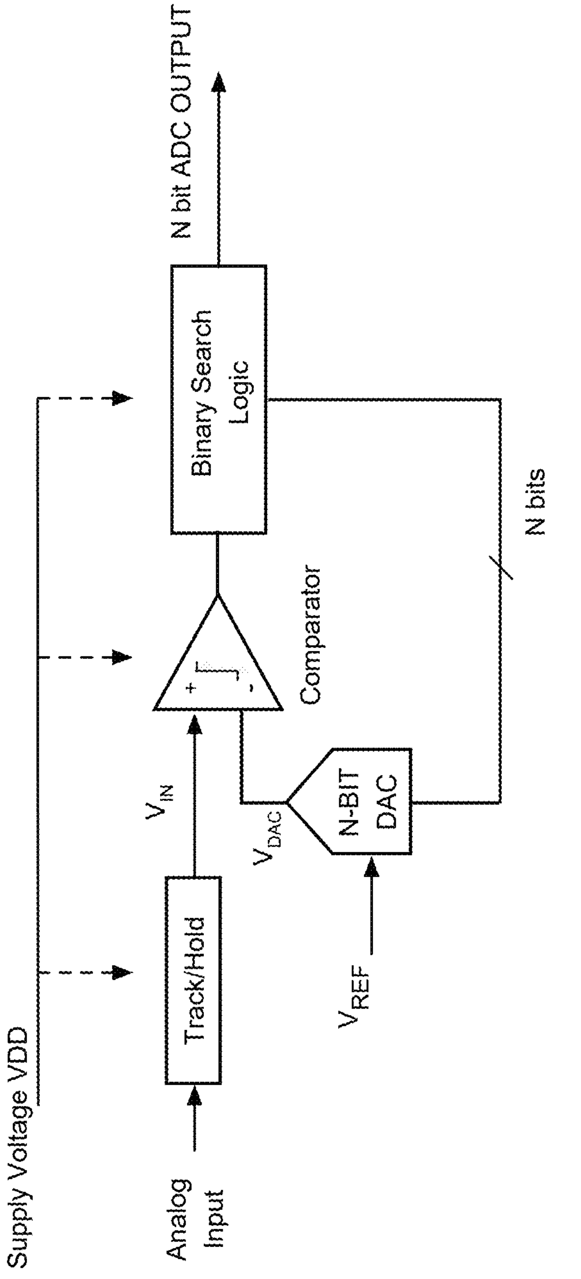
FIG. 1 illustrates a functional diagram of N-bit SARADC.
Figure 2:
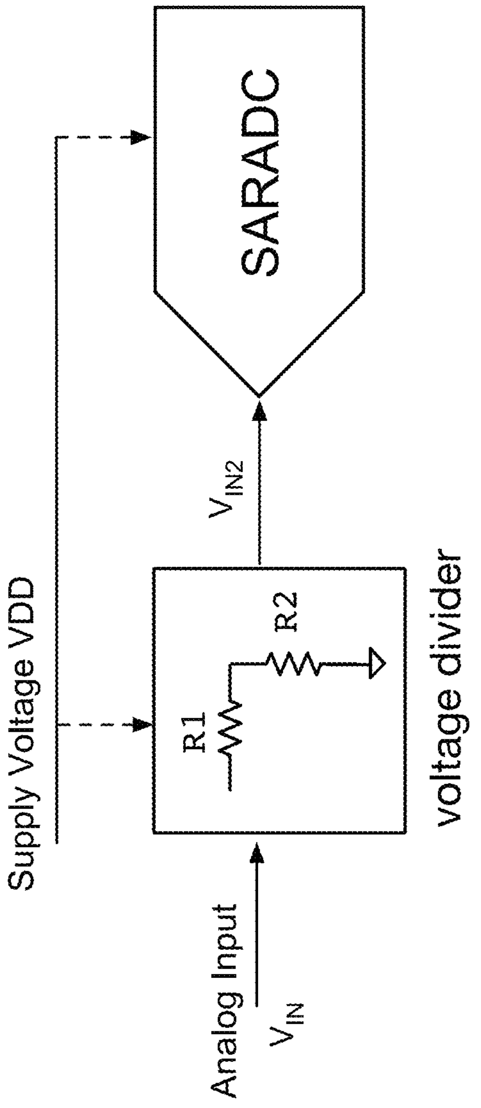
FIG. 2 illustrates a conventional implementation of voltage divider using a resistor string.
Figure 3:
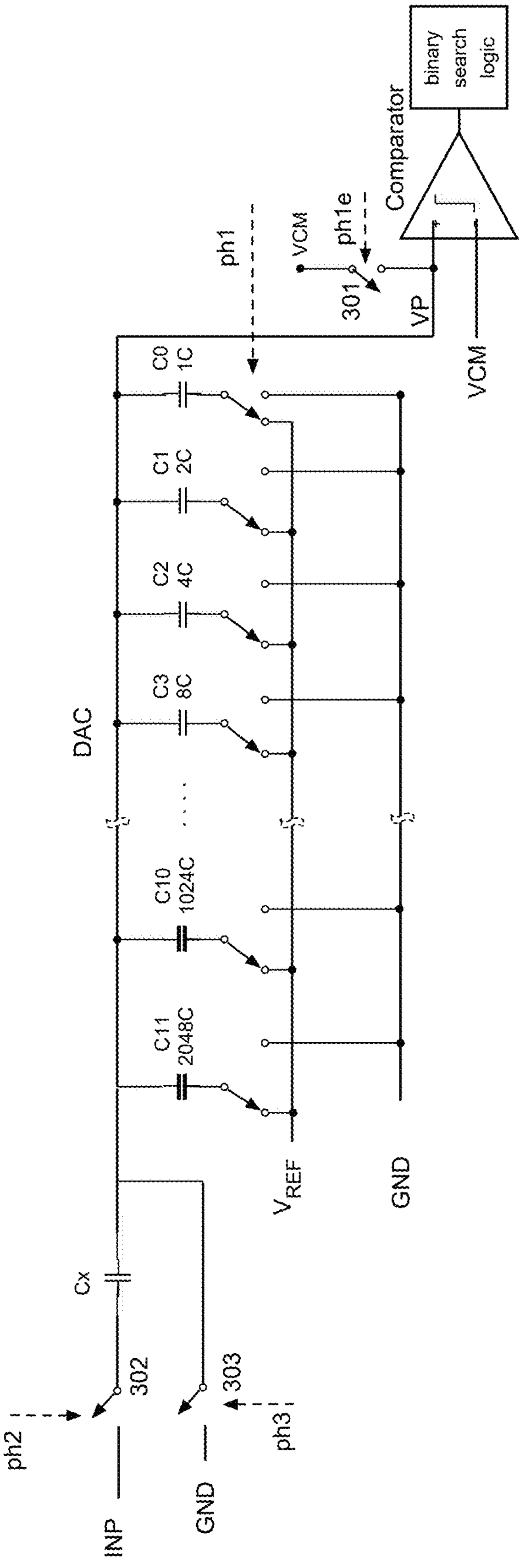
FIG. 3 depicts an exemplary embodiment of a 12-bit SARADC configured to accommodate large input voltages in a single-ended configuration.

FIG. 3 illustrates an exemplary embodiment of a 12-bit Successive Approximation Register Analog-to-Digital Converter (SARADC) configured to accommodate large input voltages in a single-ended configuration. The Digital-to-Analog Converter (DAC) includes twelve capacitors with values ranging from 1 C to 2048C. Each DAC capacitor is connected to a reference voltage (VREF) or ground (GND), with the other terminals connected to a common node, VP, which serves as the input to the comparator. A series capacitor, Cx, is introduced between the input (INP) and the DAC.

Figure 4:
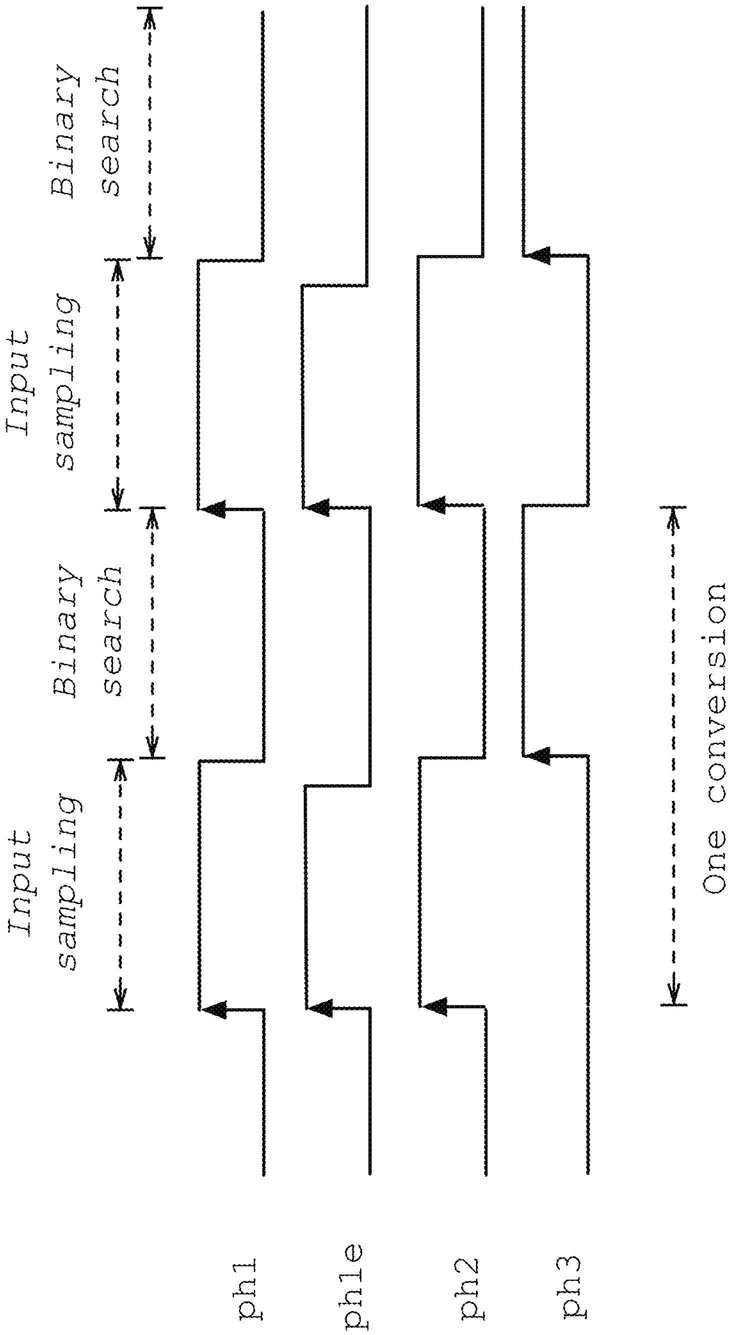
FIG. 4 illustrates the timing diagram of the control signals for the switches depicted in FIG. 3

Input switches 302 and 303 are located between the analog input (INP) and the capacitive DAC (capacitors C0, C1, C2, . . . C11). Switches 302 and 303 connect INP and ground (GND), respectively. The timing and control of these switches are governed by signals ph1, ph1*e*, ph2, and ph3, which are generated by the binary search logic. FIG. 4 provides a timing diagram that shows the relationship between these signals.

Figure 5:
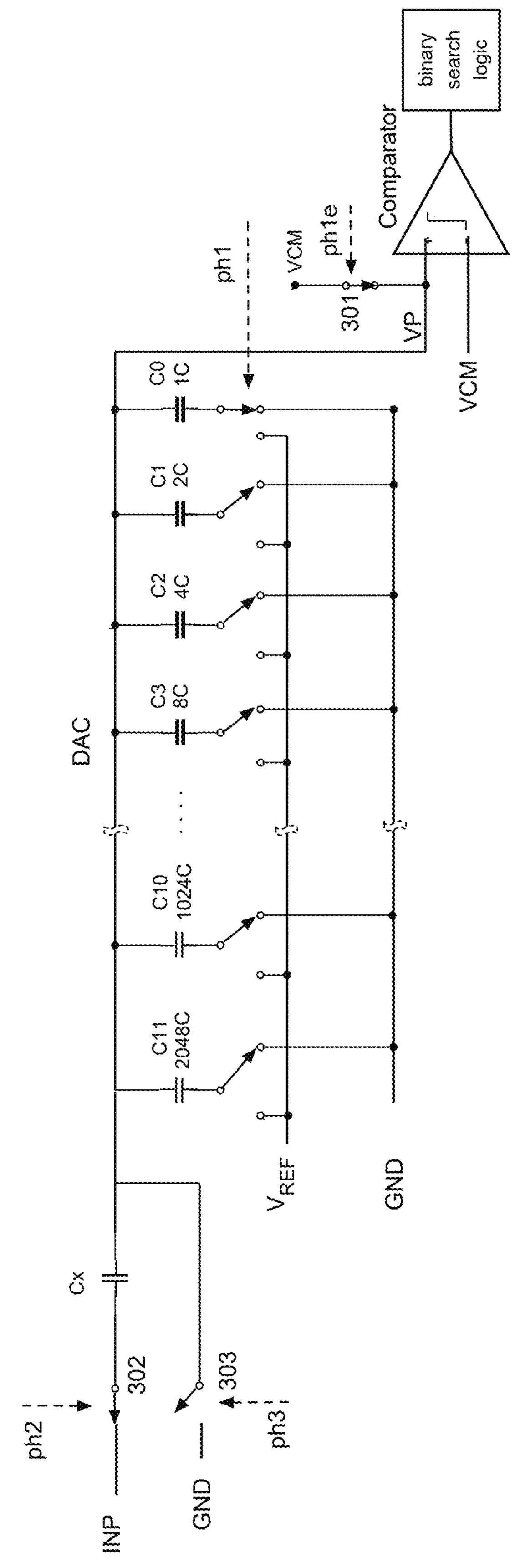
FIG. 5 shows the configuration of the SARADC at the beginning of the input sampling phase.
Figure 6:
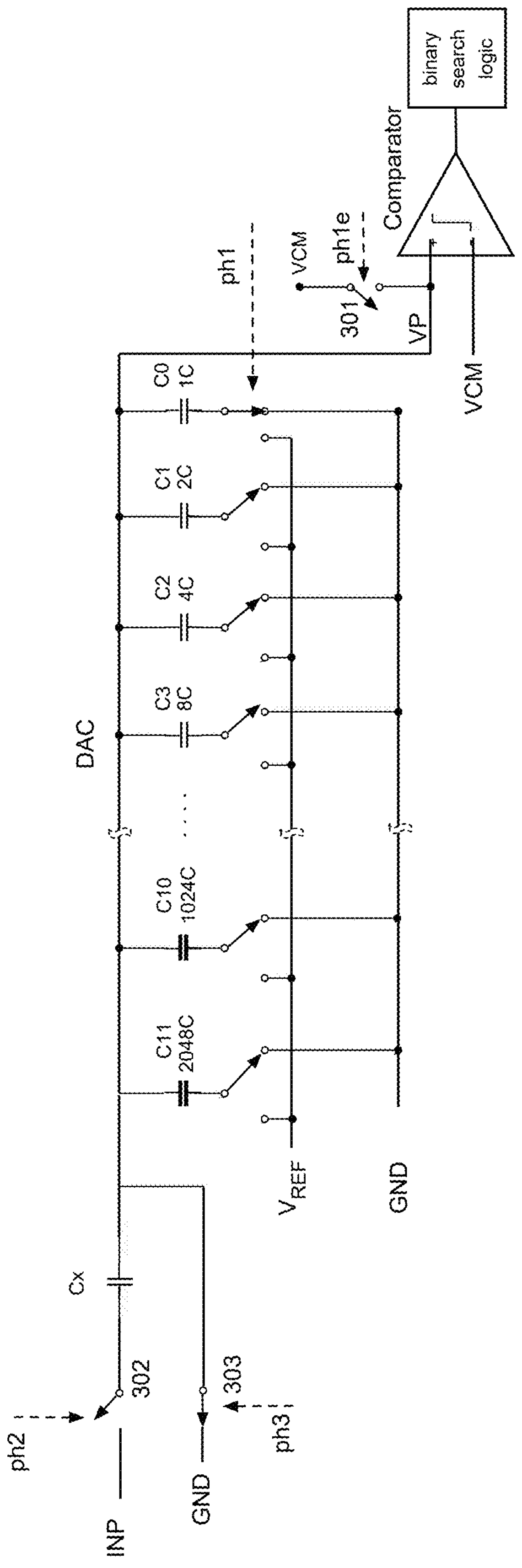
FIG. 6 shows the configuration of the SARADC at the conclusion of the input sampling phase.

During the input sampling phase, signals ph1 and ph2 are asserted, and switches 301 and 302 connect the input INP and the common-mode voltage (VCM) to the capacitive DAC, while switch 303 remains open, controlled by the binary search logic (see FIG. 5). Upon conclusion of this phase, switches 301 and 302 open, and switch 303 connects to ground (GND) (see FIG. 6). Signal ph1*e* de-asserts earlier than ph1, ensuring that switch 301 opens before switch 302, resulting in input signal-independent charge injection.

After the input sampling phase, the voltage at node VP is a function of the ratio of the series capacitor Cx to the total capacitance (Ctotal=C0+C1+ . . . +C11). For instance, if both the supply voltage (VDD) and reference voltage (VREF) are 1V and the SARADC is designed to handle input amplitudes up to 16V, the value of capacitance Cx is set to 1/15 of the total capacitance Ctotal.

Once the input voltage is reduced to a level such that its maximum does not exceed the supply voltage (VDD), the binary search phase begins. The DAC voltage at node VP adjusts based on the comparator's output and is refined through successive approximation until it converges within half the least significant bit (LSB) of the sampled input voltage.

Voltage attenuation of the input signal is achieved by introducing a series capacitor Cx between the input and the DAC capacitors. The attenuation factor is determined by the ratio of Cx to the total capacitance of the DAC. The DAC and series capacitor Cx are formed using the same unit capacitors and placed in specific arrangement to minimize mismatch and parasitic capacitance.

Figure 7:
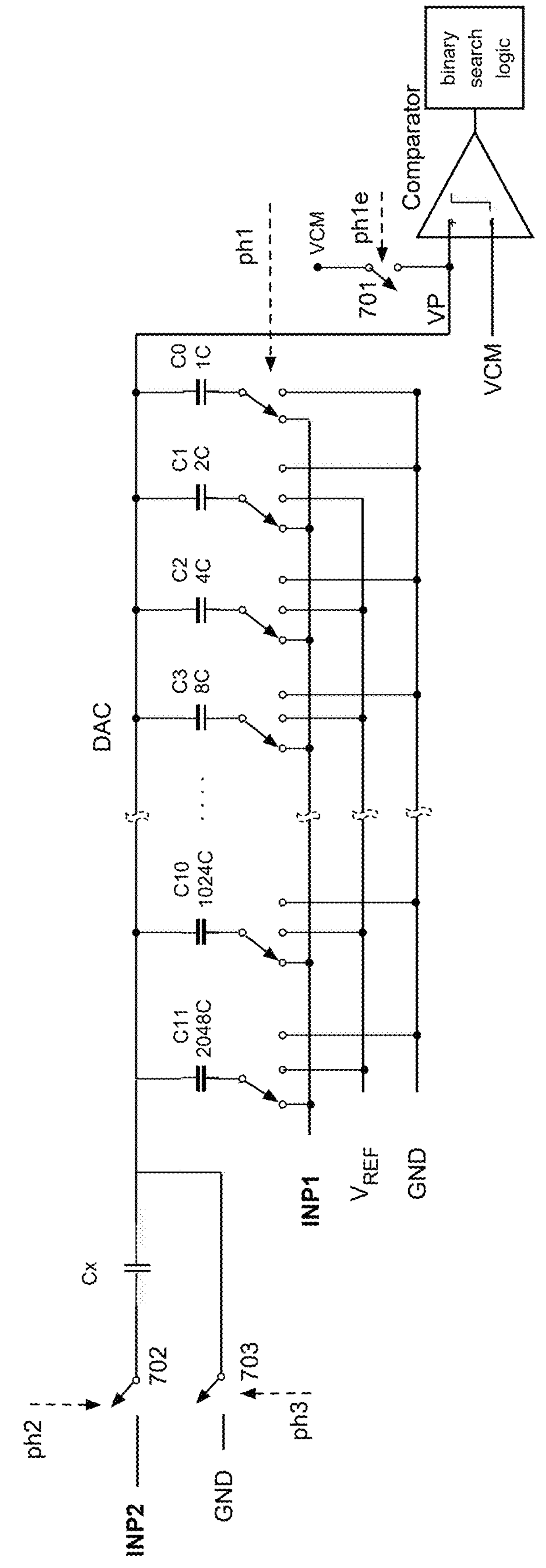
FIG. 7 depicts an embodiment of a SARADC configured to accommodate large input voltages, incorporating two single-end analog input channels.

FIG. 7 illustrates a 12-bit SARADC with two single-ended analog input channels, INP1 and INP2. The main difference from the configuration in FIG. 3 is the inclusion of these two channels. INP1 processes voltages that do not exceed the supply voltage (VDD), while INP2 handles voltages exceeding VDD.

When the INP1 channel is selected, switches 702 and 703 are opened, isolating capacitor Cx, which then acts as a floating capacitor. This configuration allows the SARADC to process input voltages up to the supply voltage. In contrast, when the INP2 channel is selected, the ADC operates as described in FIG. 3, allowing the ADC to handle voltages greater than the supply voltage.

In conventional SARADC designs, two separate ADCs are needed to handle input signals with differing voltage ranges—one for signals up to the supply voltage, and another for higher voltages, typically with a resistor divider to scale the input. The proposed configuration eliminates the need for multiple ADCs, enabling a single ADC to handle both ranges of input voltages within one unified structure. This simplifies the design, reduces circuit complexity, lowers power consumption, and improves performance compared to traditional methods that require multiple ADCs or voltage dividers.

Figure 8:
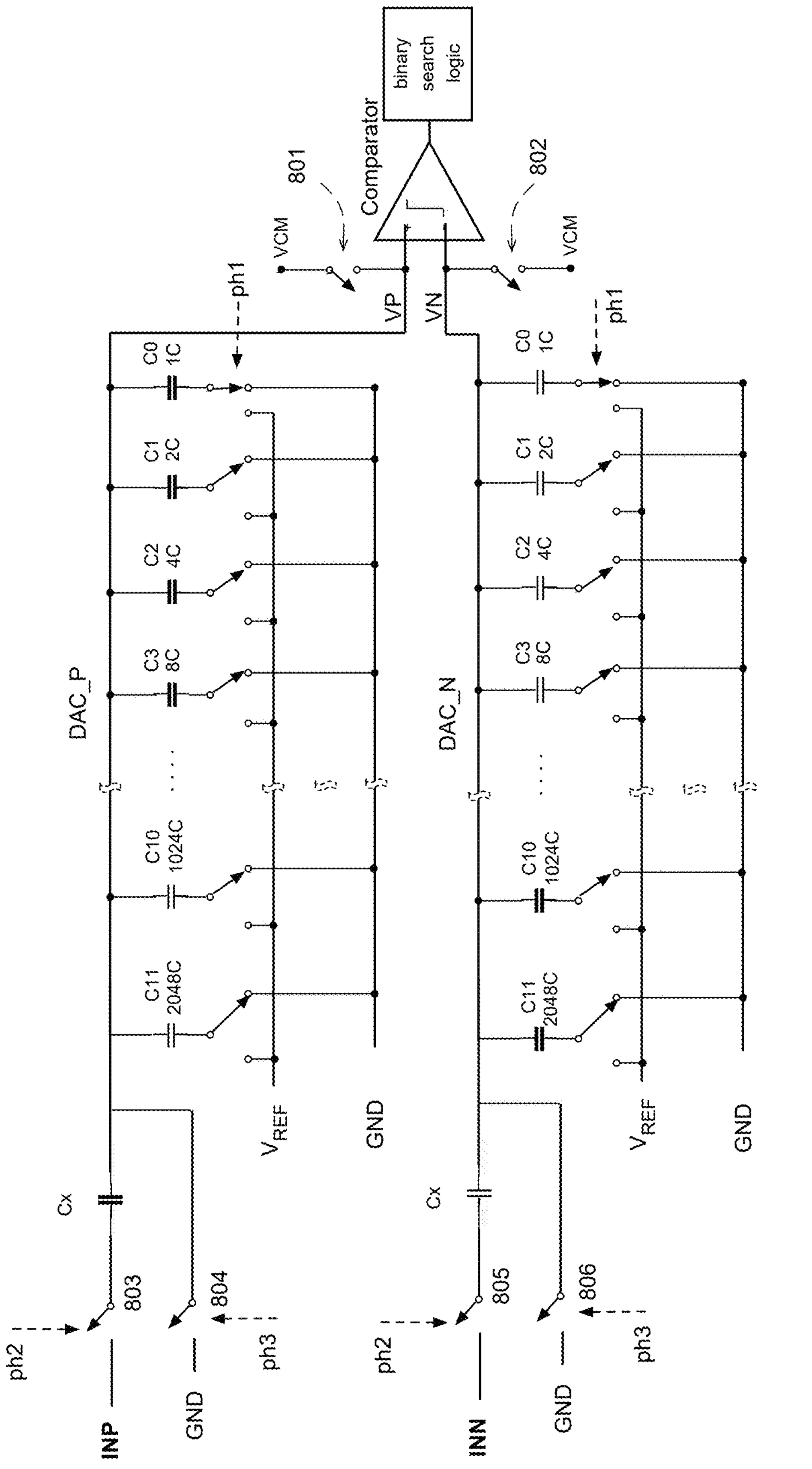
FIG. 8 illustrates an exemplary embodiment of a 12-bit SARADC configured to accommodate large input voltages in a differential configuration.

FIG. 8 shows a differential configuration of the 12-bit SARADC designed to handle large input voltages. Differential input signals INP and INN are connected to a capacitor Cx through switches 803 and 805, respectively. The differential DACs, DAC_P and DAC_N, consist of twelve capacitors (C0, C1, . . . C11) with values ranging from 1 C to 2048C. These capacitors are connected either to VREF or GND, and their other terminals are connected to the comparator inputs, VP and VN.

If the value of Cx is set to 273C, or 1/15 of the total capacitance (Ctotal=C0+C1+ . . . +C11), this configuration enables the differential inputs INP and INN to handle voltages up to 16 times VDD.

During the input sampling phase, signals ph1 and ph2 are asserted, and the differential inputs INP and INN are sampled onto Cx. At the same time, the DAC capacitors are connected to GND. Switches 801 and 802 are closed, coupling VP and VN to the common-mode voltage (VCM). At the end of this phase, switches 801 and 802 open first, followed by switches 803 and 805, while switches 804 and 806 are closed. In this configuration, the input signals are attenuated by a factor of 16, allowing the circuit to process input voltages up to 32VDD without exceeding the power supply limits.

Figure 9:
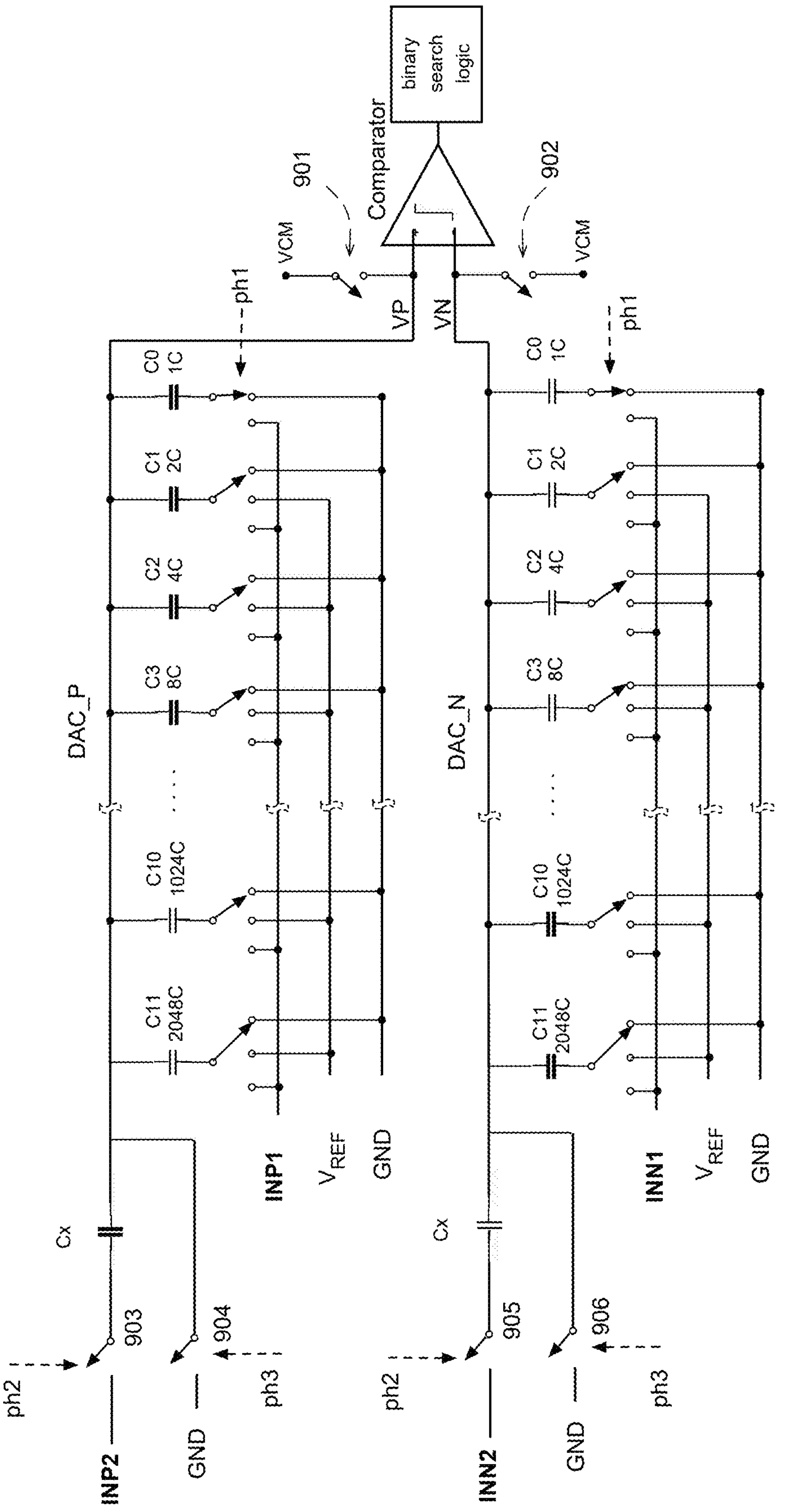
FIG. 9 depicts an embodiment of a SARADC configured to accommodate large input voltages, incorporating two differential analog input channels.

FIG. 9 depicts an embodiment of a SARADC configured to accommodate large input voltages by incorporating two differential input channels: INP1/INN1 and INP2/INN2. INP1/INN1 processes voltages up to VDD, while INP2/INN2 handles input amplitudes exceeding VDD. When INP1/INN1 is selected, switches 903/904/905/906 are opened, treating capacitor Cx as a floating capacitor. This configuration allows the SARADC to operate efficiently when the input voltage is within the supply voltage range without requiring additional circuitry.

The key advantage of this design is the ability to process input signals with varying amplitudes—both within and beyond the supply voltage—within a single configuration. This eliminates the need for separate SARADCs or voltage dividers, which typically degrade performance due to increased thermal noise and reduced accuracy. By accommodating different amplitude input channels, the proposed configuration provides a versatile solution for applications that require a wide input voltage range, while maintaining optimal performance and reducing circuit complexity.

In conclusion, this invention has been described with reference to specific embodiments. However, it will be evident that modifications and changes can be made without departing from the scope of the invention, as defined by the appended claims. The connections described herein may be any type suitable for transferring signals between nodes, units, or integrated circuit devices, whether direct or indirect. Multiple connections may be replaced by a single connection transmitting multiple signals in a time-multiplexed manner, and a single connection may be divided into multiple connections carrying subsets of signals. Thus, many options exist for transferring signals.

Those skilled in the art will recognize that the architectures described are exemplary and that alternative architectures can achieve the same functionality. Therefore, any arrangement of components that accomplish the described functionality can be considered to be "associated" with each other, irrespective of the architecture. Similarly, any two components associated with each other can be viewed as "operably connected" or "operably coupled" to achieve the desired functionality.

Boundaries between operations described herein are illustrative. Multiple operations may be combined or executed in a partially overlapping manner. Alternative embodiments may include multiple instances of an operation, and the order of operations may be changed in other embodiments.

In one embodiment, the examples may be implemented as circuitry within a single integrated circuit or device. Alternatively, the components may be implemented as separate integrated circuits or devices interconnected in a suitable manner. The drawings should therefore be viewed as illustrative rather than restrictive.

In the claims, reference signs in parentheses are not to be interpreted as limiting. The term "comprising" does not exclude the presence of other elements or steps than those listed. Terms like "a" or "an" refer to "one or more" unless otherwise stated. Thus, introductory phrases such as "at least one" and "one or more" should not limit the scope of claims to a single element, even if those terms are not explicitly repeated in each claim.

The present invention will now be described with reference to specific embodiments and accompanying drawings. However, the scope of the invention is not limited to these specific embodiments but is defined by the claims. The drawings are schematic and illustrative in nature and are not to be construed as imposing limitations. In some instances, the dimensions of certain elements may be exaggerated or not drawn to scale for purposes of clarity. The terms "first," "second," "third," and similar terms used throughout the description and claims are intended to distinguish between similar elements and should not be interpreted as implying a necessary sequence or chronological order. These terms may be interchanged as appropriate, and the invention may operate in sequences other than those described or illustrated herein.

Additionally, the term "comprising," as used in the claims, should not be interpreted as excluding additional elements or steps beyond those explicitly listed. For example, the phrase "a device comprising means A and B" does not imply that the device consists solely of components A and B, but rather that it includes at least A and B. There may be other elements or connections involved, such as pathways connecting the output of A to the input of B, which may include other devices or means. Similarly, the term "coupled" encompasses both direct and indirect coupling, and should not be limited to direct connections. Thus, the phrase "a device A coupled to a device B" does not require a direct connection between the output of A and the input of B; it means that there exists a pathway between A and B, which may include intermediate devices or means.

What is claimed is:

1. A successive approximation register (SAR) Analog-to-Digital converter (ADC) comprising:

(a) a series capacitor (Cx) and capacitive digital-to-analog converter (DAC) including a plurality of capacitors and switches connected to an input, a reference voltage or a ground, (b) a sampling circuit with switches configured to attenuate an input voltage that exceeds a supply voltage (VDD) by a predefined factor, allowing the ADC to process input signals exceeding the supply voltage, (c) a comparator and binary search logic, wherein the comparator output and binary search logic control the switches, and (d) multiple analog input channels, wherein one channel is configured to handle input voltages within the supply voltage and another channel is configured to handle input voltages exceeding the supply voltage.

2. The SARADC of claim 1, wherein the attenuation of the input voltage is determined using a series capacitor (Cx) and DAC capacitors, with Cx value being a fraction of a total capacitance of the DAC.

3. The SARADC of claim 1, wherein an input voltage attenuation factor is determined by a ratio of the series capacitor (Cx) to a total capacitance of the DAC.

4. The SARADC of claim 1, wherein the capacitive DAC comprises binary-weighted capacitors, ranging from 1C to $2^{(N-1)}$ C in an N-bit configuration, with the DAC capacitor and series capacitor (Cx) formed using unit capacitors.

5. The SARADC of claim 1, wherein an attenuation of the input voltage is controlled by predefined timing of the DAC switches, which selectively connect the capacitors to the input, the reference voltage or ground.

6. The SARADC of claim 1, wherein the binary search logic comprises an input sampling phase that is modified for SARADC operation.

7. The SARADC of claim 1, comprising an input amplitude attenuation circuit configured to process input voltages in both single-ended and differential modes.

8. The SARADC of claim 1, comprising an attenuation circuit operable without an external resistor voltage divider, thereby reducing thermal noise, circuitry complexity and power consumption.

9. The SARADC of claim 1, comprising multiple input channels for different voltage amplitudes to reduce circuitry complexity, power consumption and silicon area requirements.

10. A method of performing Successive approximation register (SAR) Analog-to-Digital (ADC) conversion, comprising:

(a) providing a series capacitor (Cx) and capacitive digital-to-analog converter (DAC) comprising a plurality of capacitors and switches connected to input, a reference voltage or ground, and (b) providing a sampling circuit with switches configured to attenuate an input voltage that exceeds the supply voltage (VDD) by a predefined factor, allowing the ADC to process input signals exceeding the supply voltage, and (c) providing a comparator and binary search logic wherein the comparator output and binary search logic control the associated switches, and (d) sampling multiple analog input channels, wherein one channel is configured to handle input voltages within the supply voltage and another channel is configured to handle input voltages exceeding the supply voltage range.

11. The method of claim 10, comprising attenuating the input voltage using a series capacitor (Cx) and DAC capacitors, with Cx value being a fraction of a total capacitance of the DAC.

12. The method of claim 10, comprising determining an input voltage attenuation factor by a ratio of the series capacitor (Cx) to the total capacitance of the DAC.

13. The method of claim 10, wherein the capacitive DAC comprises binary-weighted capacitors, ranging from 1C to $2^{(N-1)}$ C in an N-bit configuration, comprising forming the DAC capacitor and series capacitor (Cx) using unit capacitors.

14. The method of claim 10, comprising attenuating the input voltage by predefined timing of the DAC switches, which selectively connect the capacitors to the input, the reference voltage or ground.

15. The method of claim 10, comprising operating the SAR ADC with an input sampling phase and a binary search phase, and only the input sampling phase is modified.

16. The method of claim 10, further comprising sampling multiple analog input channels, wherein one channel is configured to handle input voltages within the supply voltage and another channel is configured to handle input voltages exceeding the supply voltage range.

17. The method of claim 10, wherein the input amplitude attenuation circuit is configured to process input voltages in both single-ended and differential modes.

18. The method of claim 10, wherein the attenuation circuit operates without an external resistor voltage divider, comprising reducing thermal noise, circuitry complexity and power consumption.

19. The method of claim 10, comprising receiving multiple input channels for different voltage amplitudes to reduce circuitry complexity, power consumption and silicon area requirements.

* * * * *